United States Patent [19]

Kawai

[11] Patent Number: 5,210,599
[45] Date of Patent: May 11, 1993

[54] SEMICONDUCTOR DEVICE HAVING A BUILT-IN CAPACITOR AND MANUFACTURING METHOD THEREOF

[75] Inventor: Takahisa Kawai, Kawasaki, Japan
[73] Assignee: Fujitsu Limited, Kawasaki, Japan
[21] Appl. No.: 844,914
[22] Filed: Mar. 5, 1992

Related U.S. Application Data

[63] Continuation of Ser. No. 707,298, May 29, 1991, abandoned, which is a continuation of Ser. No. 413,749, Sep. 28, 1989, abandoned.

[30] Foreign Application Priority Data

Sep. 30, 1988 [JP] Japan .................................. 63-248852

[51] Int. Cl.[5] ........................ H01L 27/02; H01L 29/06; H01L 29/12; H01L 39/02
[52] U.S. Cl. .................................. 257/534; 257/301; 257/621; 257/622; 257/774
[58] Field of Search ..................... 357/51, 80, 23.6, 55, 357/58

[56] References Cited

U.S. PATENT DOCUMENTS 4,737,838  4/1988  Watanabe ........................... 357/51
4,959,705  9/1990  Lemnios et al. ..................... 357/51

FOREIGN PATENT DOCUMENTS 51-118971  10/1976  Japan .
51-135480  11/1976  Japan .
57-104265   6/1982  Japan ................................. 357/51
61-187278   8/1986  Japan .
   218371  10/1983  United Kingdom ................ 357/80

Primary Examiner—J. Carroll
Attorney, Agent, or Firm—Staas & Halsey

[57] ABSTRACT

A semiconductor device having a built-in capacitor comprises a substrate, an internal electrode provided on a top side of the substrate, a dielectric film provided so as to cover the internal electrode for establishing a predetermined capacitance, a surface electrode provided on the dielectric film so as to make a contact therewith, a plurality of through holes formed in the substrate in correspondence to the internal electrode so as to extend from a bottom side to the top side, and a back-side electrode provided on the bottom side of the substrate including the through holes so as to make a contact with the internal electrode through the through holes.

7 Claims, 5 Drawing Sheets

SEMICONDUCTOR DEVICE HAVING A BUILT-IN CAPACITOR AND MANUFACTURING METHOD THEREOF

This application is a continuation of application Ser. No. 07/707,298 filed May 29, 1991, abandoned, which is a continuation of application Ser. No. 07/413,749 filed Sep. 28, 1989, abandoned.

BACKGROUND OF THE INVENTION

The present invention generally relates to semiconductor devices and more particularly to a semiconductor device having a built-in capacitor and a manufacturing method thereof.

A so-called microwave monolithic integrated circuit (MMIC) is a semiconductor device designed for use in the ultra-high frequency (UHF) range or in the super-high frequency (SHF) range. Such an integrated circuit for microwave application often uses a shunt capacitor having an electrode connected to the ground.

FIG. 1 shows a typical MMIC device comprising a pair of FETs forming a two-stage amplifier circuit. In this device, a plurality of capacitors $C_1$ are interposed in a signal path extending from an input terminal IN to an output terminal OUT and there is further provided a shunt capacitor $C_2$ in the vicinity of a gate biasing terminal G or a drain biasing terminal D for removing unwanted high frequency components. Further, there is another shunt capacitor $C_3$ connected to the signal path for achieving impedance matching.

Conventionally, impedance matching of the signal path in the MMIC is achieved by providing an open stab acting as a capacitance, of which its size is adjusted so as to achieve proper impedance matching. However, such an open stab occupies a large area and needs trimming to establish a desired impedance. It is preferred to achieve such an impedance matching by using the shunt capacitor $C_3$ designed to have a proper capacitance value. The present invention is mainly related to such a shunt capacitor having one electrode connected to the ground or other constant voltage source for bypassing the high frequency component to the ground or used for impedance matching.

FIG. 2 is a cross sectional view showing the structure of a prior art shunt capacitor. Referring to the drawing, the shunt capacitor comprises a semi-insulating substrate 11 of gallium arsenide, and an internal electrode 12a is provided on the substrate in correspondence to where the capacitor is to be formed. On the internal electrode 12a, there is further provided a dielectric film 12b and a surface electrode 12c is provided further thereon so as to make an electrical contact with the dielectric film 12b. This surface electrode 12c is connected to a transmission strip 13 forming the signal path. On the rear, or bottom substrate 11, it can be seen that there is formed a large through hole 10 in correspondence to the internal electrode 12a so as to expose a central part of the electrode 12a, and a ground electrode 14 is provided on the bottom of the substrate 11 including an inner surface 10a of the contact hole 10. Further, the ground electrode 14 is connected to a metal base 15 having a ground potential level via a brazing filler 16 and thus there is formed a shunt capacitor region having one electrode 12c connected to the transmission strip 13 and the other electrode 14 connected to the ground. Conventionally, the contact hole 10 is formed by removing a part of the substrate 11 corresponding to the contact hole 10 by isotropic etching. FIG. 3 shows a connection of the shunt capacitor of FIG. 2 to the MMIC shown in FIG. 1. As can be seen in the drawing, the transmission strip 13 formed on the substrate 11 is connected to the surface electrode 12c via an airbridge structure 13a.

In such a prior art capacitor, there is a problem in that the shunt capacitor thus formed is mechanically fragile as the through hole 10 has a semi-circular vertical cross section which contacts tangentially with the internal electrode 12a and there is formed a thin central region in the substrate 11 in correspondence to a central part of the contact hole 10. When the substrate 11 is brazed on the metal base 15, for example, there usually remains a small amount of air at the top of the brazing filler 16 filling the contact hole 10 as designated by a space 15a. The air filling the space 15a reduces its volume upon cooling and as a result, the thin region at the central part of the contact hole 10 tends to be broken because of the air pressure acting on the central part of the contact hole 10.

In the prior art capacitor illustrated in FIG. 1, there exists another problem in that one has to provide an unnecessarily large internal electrode 12a so as to tolerate variation of size of the contact hole 10, as the exact control of wet etching to form the contact hole 10 having an exact size is difficult in the presently available technique. Associated therewith, there are formed a number of parasitic paths between the internal electrode 12a and the bottom electrode 14 as illustrated in FIG. 1 by parasitic capacitors $C-C_3$ and as a result, there arises still another problem in that the electrical property of the shunt capacitor is deviated from the designed value. As the region of the substrate 11 corresponding to the central part of the contact hole 10 has a reduced thickness, the effect of these parasitic capacitors is not negligible. Because of the poor control of the size of the contact hole 10 as already described, it is not possible to design the shunt capacitor by taking the effect of these parasitic capacitors into consideration in advance.

Further, as a result of the excessive extension of the internal electrode 12a, a part of the high frequency signal component which has passed the dielectric film 12b from the surface electrode 12c to the internal electrode 12a is guided to the bottom electrode 14 by passing through the internal electrode 12a laterally. Thereby, the high frequency signal component experiences inductance formed by the internal electrode 12a.

FIG. 4 shows an equivalent circuit diagram of the shunt capacitor of FIG. 2. In the drawing, the capacitance of the dielectric film 12b is represented by $C_0$ and the designed capacitance value C of the shunt capacitor 12 is given by a parallel connection of the capacitors $C_0$. Further, it can be seen that there appear parasitic inductances $L_1-L_3$ extending laterally along the internal electrode 12a and each end of each of the inductances $L_1-L_3$ is connected to the ground by the aforementioned parasitic capacitors $C_1-C_3$. As a result, there is formed a parasitic circuit C' comprising the parasitic inductances $L_1-L_3$ and the parasitic capacitances $C_1-C_3$ interposed between the capacitor 12 and the ground electrode 14. Note that the parasitic capacitors $C_1$ at the central region of the contact hole 10 has a capacitance which cannot be neglected because of the reduced thickness at the central region of the contact hole 10 while the respective capacitances of the capacitors $C_2$ and $C_3$ decrease in value towards the marginal region of the contact hole 10 because of the increased thickness of the substrate 11. Further, there is formed an additional parasitic inductance $L_0$ between the internal electrode 12a and the ground electrode 14 at the center of the contact hole 10. In one example, it was found that the parasitic inductances $L_1$–$L_3$ are about ten times larger than the parasitic inductance $L_0$. In other words, the effect of the parasitic inductances $L_1$–$L_3$ cannot be neglected. Thus, the impedance of the parasitic circuit C′ in FIG. 3 is not negligible. To make the matter worse, the impedance of the parasitic circuit C′ is varied device by device.

SUMMARY OF THE INVENTION

Accordingly, it is a general object of the present invention to provide a novel and useful semiconductor device having a built-in capacitor and a manufacturing method thereof.

Another and more specific object of the present invention is to provide a semiconductor device having a built-in capacitor and a manufacturing method thereof wherein the mechanical strength of the shunt capacitor is improved.

Another object of the present invention is to provide a semiconductor device having a built-in capacitor and a manufacturing method thereof wherein the effect of parasitic capacitance and inductance is reduced.

Another object of the present invention is to provide a semiconductor device having a built-in capacitor and a manufacturing method thereof wherein a desired capacitance is obtained with reliability.

Another object of the present invention is to provide a semiconductor device having a built-in capacitor exhibiting an excellent performance in the UHF and SHF frequency range.

Another object of the present invention is to provide a semiconductor device having a built-in capacitor comprising an internal electrode provided on a substrate, a dielectric film provided on the internal electrode and a surface electrode further provided on the dielectric film, wherein there are provided a plurality of contact holes by anisotropic etching so as to extend, each with substantially the same diameter, from the bottom of the substrate to the internal electrode, and a ground electrode is provided on the bottom of the substrate so as to make contact with the internal electrode through the contact holes. According to the present invention, the contact holes each have a side wall which extends substantially vertically to the substrate and the formation of parasitic capacitors between the internal electrode and the ground electrode at a part of the substrate where the thickness of the substrate is reduced is avoided. Further, as a plurality of contact holes are formed, a high frequency signal component applied to the surface electrode is directly passed to the ground electrode via each of the contact holes without laterally travelling through the internal electrode. Thus, the effect of inductance experienced by the high frequency signal component is minimized. In other words, the effect of parasitic capacitance and inductance which causes unpredictable deviation of capacitance in the built-in capacitor in the prior art device is successfully eliminated by the present invention. Furthermore, the built-in capacitor thus formed has a satisfactory mechanical strength as there is formed no fragile thin region in the substrate in correspondence to the center of the contact holes. Note that the contact holes are formed by anisotropic etching which provides a substantially vertical wall.

Other objects and further features of the present invention will become apparent from the following detailed description when read in conjunction with attached drawings.

DETAILED DESCRIPTION

Figure 5:
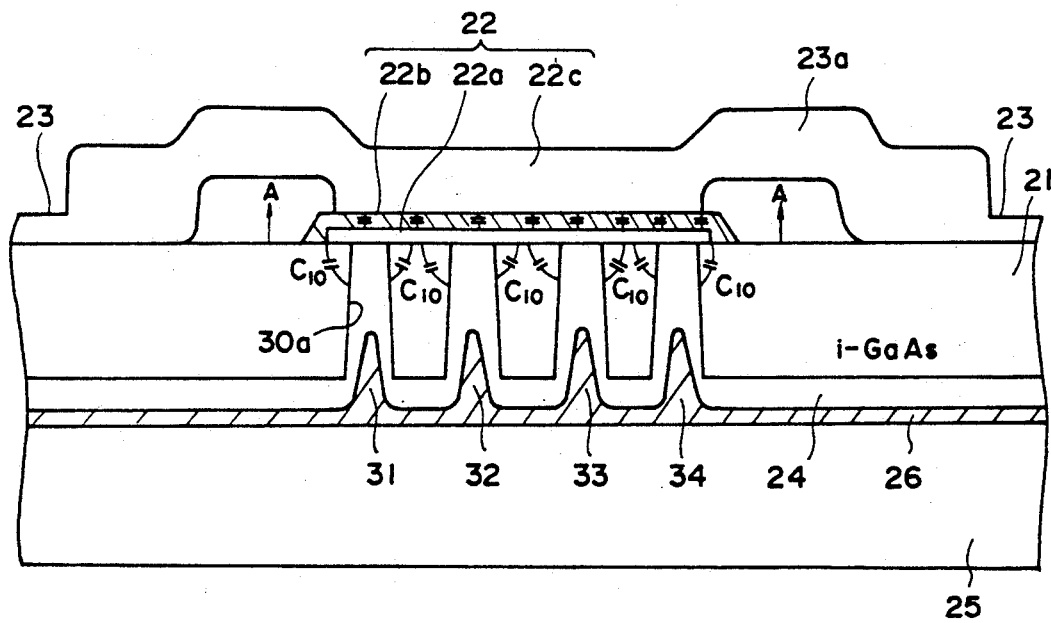
FIG. 5 is a cross sectional view showing a shunt capacitor according to an embodiment of the present invention.

FIG. 5 shows the structure of a shunt capacitor formed in a semiconductor device according to an embodiment of the present invention. Referring to the drawing, the shunt capacitor comprises a semi-insulating substrate 21 of gallium arsenide having a thickness of 50–100 $\mu$m, and an internal electrode 22a is provided on the substrate in correspondence to where the capacitor is to be formed. On the internal electrode 22a, there is further provided a dielectric film 22b and a surface electrode 22c is provided further thereon so as to make an electrical contact with the dielectric film 22b. This surface electrode 22c may have a size of 150 $\mu$m × 150 $\mu$m, for example, and is connected to a transmission strip 23 forming the signal path by an airbridge structure 23a. On the rear, or bottom, side of the substrate 21, it can be seen that there is formed a plurality of through holes or contact holes 31–34 in correspondence to a part of the substrate 21 covered by the internal electrode 22a. Thereby, the internal electrode 22a is exposed at a plurality of locations in correspondence to the contact holes 31–34 and a ground electrode 24 having a thickness of about 3–5 $\mu$m is provided on the bottom of the substrate 21 including an inner surface 30a of the contact holes 31–34. Further, the ground electrode 24 is fixed on a metal base 25 having a ground potential level and acting as a heat sink by a brazing filler 26 of gold-tin alloy and thus there is formed a shunt capacitor region 22 wherein one electrode 22c is connected to the transmission strip 23 and the other electrode 24 is connected to the ground.

Figure 6:
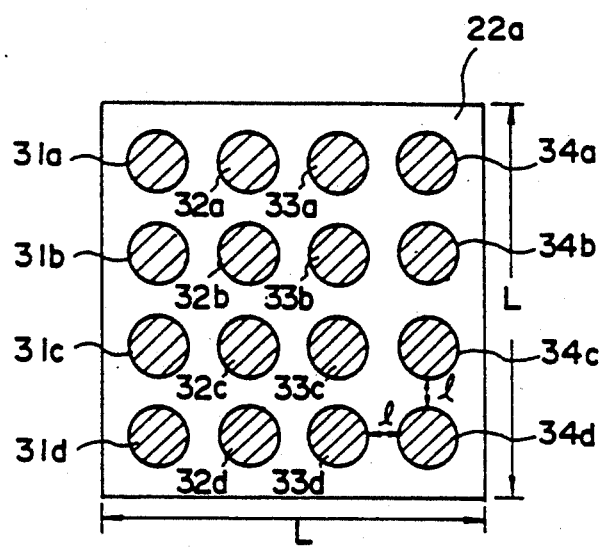
FIG. 6 is a plan view showing an array of contact holes used in the capacitor of FIG. 5.

FIG. 6 shows the shunt capacitor region 22 in a plan view. Referring to the drawing, there are formed sixteen contact holes 31a–31d, 32a–32d, 33a–33d and 34a–34d with a substantially equal mutual separation 1 which is the shortest distance measured from an edge of a contact hole to an adjacent edge of an adjacent contact hole. In the present invention, it is preferred to set the separation 1 to 10–20 $\mu$m or less and the diameter of the contact holes is preferrably set also to 10–20 $\mu$m.

In the present invention, the contact holes 31a–31d, 32a–32d, 33a–33d and 34a–34d are formed by anisotropic etching, proceeding vertically to the substrate 21 and as a result, the side wall 30a of each contact hole thus formed becomes generally vertical to the substrate 21 or at least assumes a steep angle substantially larger than 45 degrees with respect to the substrate as illustrated in FIG. 5. Because of the steep angle of the side wall 30a, the parasitic capacitors $C_{10}$ formed between the internal electrode 22a and the ground electrode 24 have a value which is insignificant or negligible. As a result, the capacitance of the shunt capacitor is not affected by the parasitic capacitor $C_{10}$. Further, because of the steep angle of the side wall 30a with respect to the substrate 21, there is no thin region formed in the substrate 21 in contrast to the prior art device and the mechanical stability of the obtained shunt capacitor is improved. Thus, even if there remains air between the ground electrode 24 and the brazing filler 26 at the time of brazing of the device on the metal base 25, the contraction of the air volume upon cooling does not cause destruction of the device because of the improved mechanical strength. Furthermore, because of the steep angle of the side wall 30a, the variation of the anisotropic etching forming the contact holes 31-34 does not cause significant variation in the diameter of the contact holes and the structure shown in FIG. 6 is obtained with reliability. In other words, the hitherto needed excessively large size of the internal electrode as well as of the dielectric film thereon for tolerating the variation of the contact hole can be eliminated by forming the contact holes by anisotropic etching.

Furthermore, as a result of the plural contact holes provided with a sufficiently small mutual separation, a high frequency signal applied to the surface electrode 23a is immediately grounded through these plurality of contact holes and as a result, there is achieved an advantage such that: a) the inductance formed between a pair of neighboring contact holes is small; and b) the high frequency signal is not affected by these inductances when it is bypassed to the ground even when there exists finite inductance between the contact holes.

Figure 7:
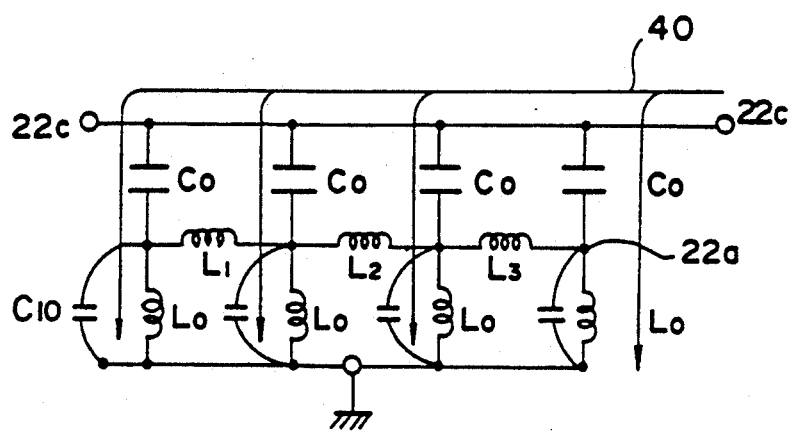
FIG. 7 is an equivalent circuit diagram of the shunt capacitor of FIG. 5.

FIG. 7 is an equivalent circuit diagram of the shunt capacitor of the present invention. Referring to the drawing, a high frequency signal 40 is applied to the surface electrode 22c from the transmission line 23. This signal is then passed through the dielectric film 22b having the capacitance $C_0$ and is bypassed to the ground after passing through a small inductance $L_0$ formed between the internal electrode 22a and the ground electrode 24. The parasitic capacitance $C_{10}$ connected parallel to the inductance $L_0$ is of a very small value as already described and thus does not affect the transfer characteristic of the shunt capacitor.

Although there are formed lateral inductances $L_1$-$L_3$ in the internal electrode 22a each thereof connected between a pair of the parallel inductances $L_0$ as illustrated in FIG. 7, these inductances do not affect the transfer of the high frequency signal 40 as the contact holes 31-34 are provided with a sufficiently small mutual separation and the signal is bypassed to the ground without flowing through these inductances. Even when there are currents flowing through the internal electrode 22a laterally, the effect of these lateral inductances is small and the effect of the parasitic inductance is negligible.

Figure 8A:
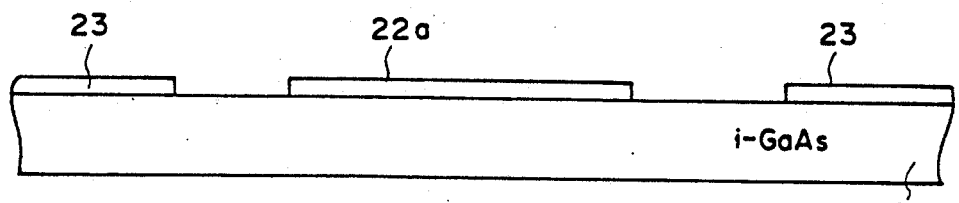
FIGS 8(A)–8(D) are diagrams showing steps of forming the shunt capacitor of FIG. 5.

Next, manufacturing of the shunt capacitor of FIG. 5 will be described with reference to FIGS. 8(A)-(D). In a first step, a photoresist (not shown) is provided on the substrate 21 having a thickness of about 400 μm to 900 μm and after suitable patterning, a part of the substrate 21 corresponding to the internal electrode 22a of the shunt capacitor 22 and another part of the substrate 21 corresponding to the transmission strip 23 are removed by etching. Further, the first part and the second part of the substrate 21 thus removed are successively deposited with titanium, platinum and gold by vacuum deposition and the internal electrode 22a and the transmission strip 23 are formed with an overall thickness of about 2000 Å. FIG. 8(A) shows a structure thus obtained after the removal of the photomask. As already described, the internal electrode 22a is formed to have a size of 100-150 μm for each edge.

Next, the dielectric film 22b is formed by depositing silicon nitride by chemical vapor deposition or sputtering such that a layer of silicon nitride is formed with a thickness of about 1500 Å on the structure of FIG. 8(A). Further, a part of the silicon nitride layer corresponding to the dielectric film 22b is protected by a photoresist and the rest of the silicon nitride layer is removed by dry etching using a fluoride etching gas. Thus, the dielectric film 22b is formed as illustrated in FIG. 8(B).

Figure 1:
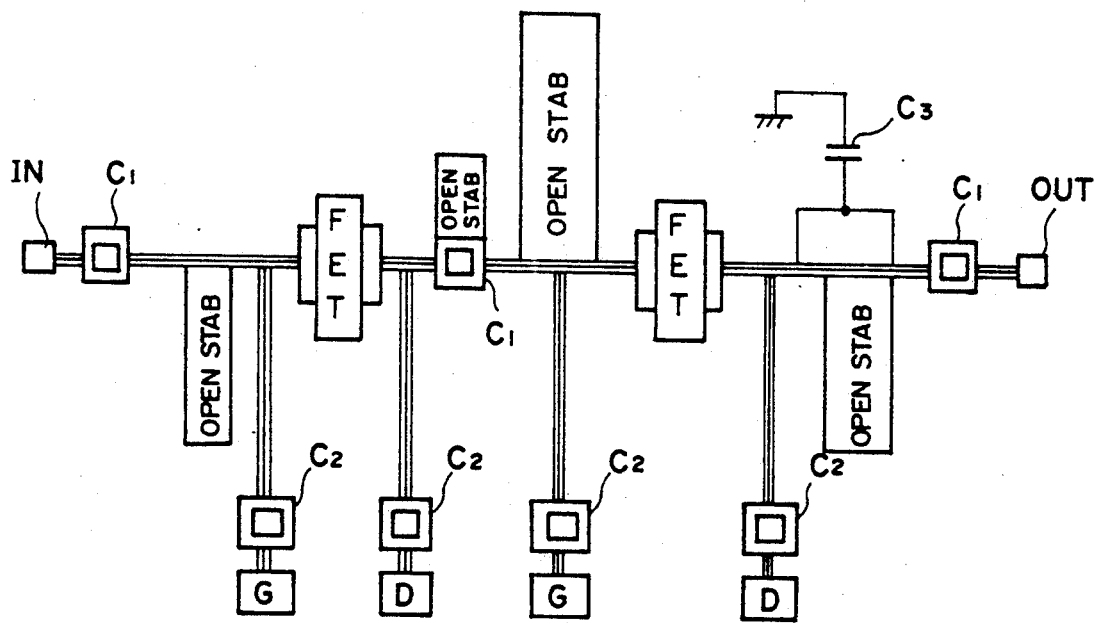
FIG. 1 is a block diagram showing a prior art MMIC device having a built-in capacitor.
Figure 2:
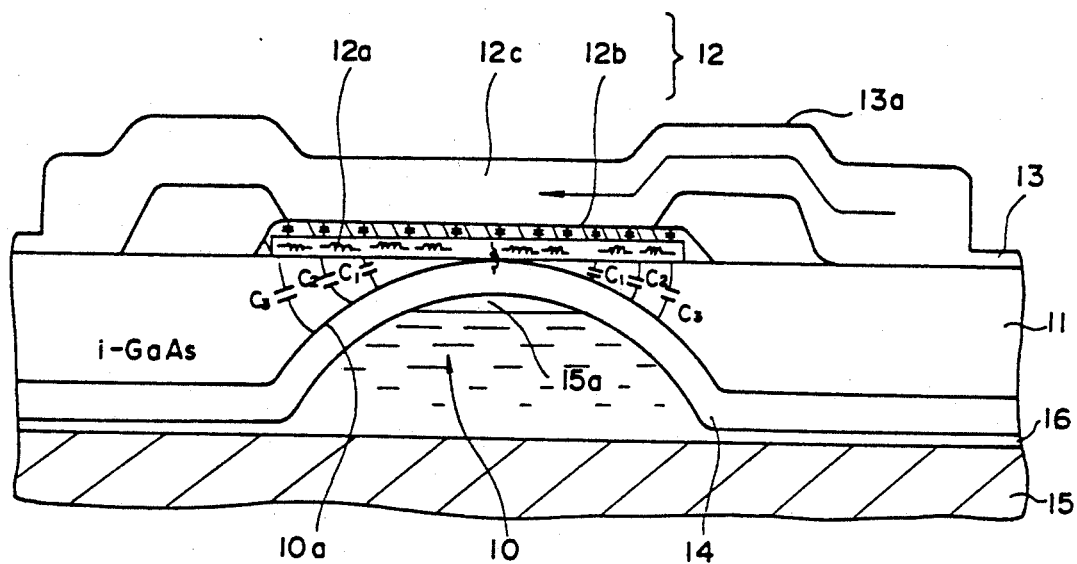
FIG. 2 is a cross sectional view of a prior art shunt capacitor of the type used in the device of FIG. 1.
Figure 3:
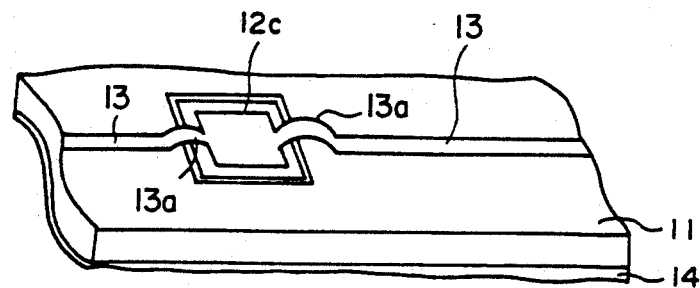
FIG. 3 is a perspective view showing the connection of the capacitor of FIG. 2 in the device of FIG. 1.
Figure 4:
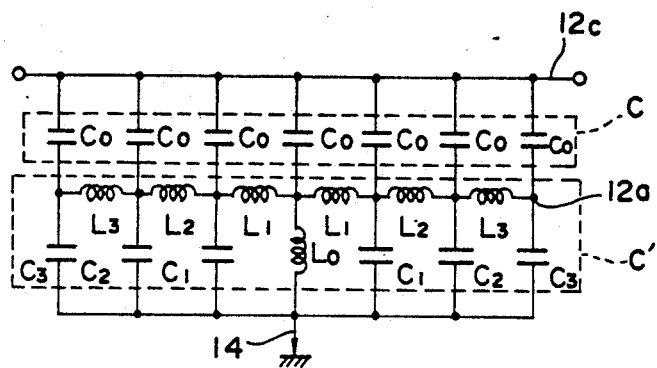
FIG. 4 is an equivalent circuit diagram of the shunt-capacitor of FIG. 2.
Figure 8B:
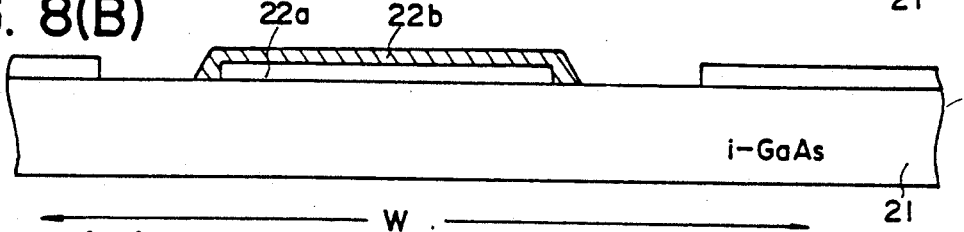

Next, a photoresist is applied on the structure of FIG. 8(B) and after a patterning to expose the dielectric film 22b and the transmission strip 23, a metal layer $22C_1$ comprising stacking of a titanium layer and a gold layer is deposited on the entire surface of the structure thus formed. Note that there is formed a photoresist 50 in correspondence to the air bridge structure 23a on a pair of opposing edges of the dielectric film 22b, and the aforementioned metal layer $22C_1$ is deposited on this photoresist 50. Next, the metal layer $22C_1$ is selectively covered by a photoresist 51 so as to expose only a part W shown in FIG. 8(C) and gold is plated on the metal layer $22C_1$ selectively. As a result, a structure shown in FIG. 3(C) is obtained wherein a thick gold layer $22C_2$ is formed on the metal layer $22C_1$ in correspondence to the part W.

Figure 8C:
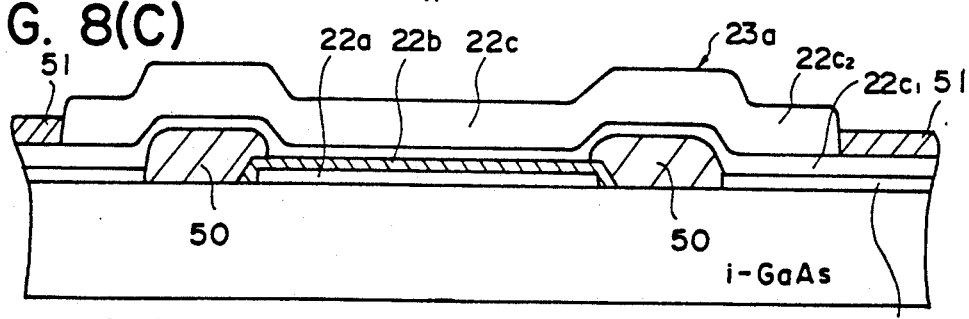

Next, the photoresist 51 selectively covering the structure of FIG. 8(C) is removed and a part of the gold layer in the layer $22C_1$ not covered by the gold layer $22C_2$ is removed by ion milling. Further, the titanium layer in the layer $22C_1$ is removed by dry etching. Next, the photoresist 50 is removed by a suitable means such as dipping into a solvent and the surface electrode 22c is formed. Further, the back-side of the wafer is lapped to the required thickness (typically 50 to 100 μm).

Further, a photoresist (not shown) defining the contact holes 31-34 is deposited on the bottom of the substrate 21 and the bottom of the substrate 21 is subjected to the reactive ion etching (RIE) using a chloride etching gas. In one example, carbon dichloride difluoride ($CCl_2F_2$) was used as the etching gas and the RIE process was performed under a pressure of about 20 mTorr with an electrical power density of 0.4 W/cm$^2$. For this purpose, a direct-current voltage of 200 volts was applied across a pair of parallel electrodes of the etching apparatus (not shown). The etching was continued until the contact holes 31-34 reach the internal electrode 22a. As the RIE process proceeds selectively in a vertical direction to the substrate 21, the obtained contact holes 31-34 have steep or substantially vertical, respective side walls extending directly to the internal electrode 22a. The diameter of the contact hole is usually set to about 10-20 μm. As a result, a structure shown in FIG. 8(D) is obtained.

Figure 8D:
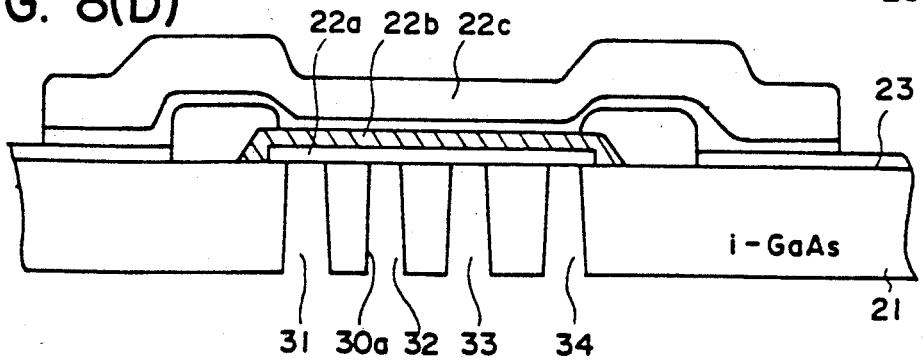

The structure of FIG. 8(D) then has deposited on the bottom surface thereof a nickel-chromium alloy (NiCr) by vacuum deposition such that not only the bottom of the substrate 21 but also the bottom as well as the side walls of the contact holes 31-34 are covered uniformly with a thickness of about 1000 Å. Next, gold is plated on the nickel-chromium alloy layer with a thickness of about 3-5 μm and the contact (ground) electrode 24 (of FIG. 5) is formed. The structure thus formed is then brazed on the metal base 25 by using a gold-tin alloy having a melting temperature of about 350° C. and the structure shown in FIG. 5 is completed.

Further, the present invention is not limited to these embodiments but various variations and modifications may be made without departing from the scope of the present invention.

What is claimed is:

1. A semiconductor device having a built-in capacitor, comprising:
    a substrate having upper and lower main surfaces;
    an internal electrode formed on said upper main surface of said substrate, said internal electrode comprising a unitary segment of a conductive material, of a given configuration and area in a plane parallel to said upper main surface and having a lower surface on said upper main surface of said substrate and an upper surface;
    a dielectric film formed on an covering said internal electrode;
    a surface electrode formed on said dielectric film and in contact therewith, said surface electrode including at least a portion of a corresponding said configuration and area, in opposed relationship to the internal electrode and separated therefrom by the dielectric film when viewed in a plane transverse to the upper main surface of the substrate, said potion of the surface electrode together with said dielectric film and said internal electrode establishing a single capacitor;
    an array of plural through holes formed in the substrate in correspondence to the single capacitor, said plural through holes extending in substantially parallel and spaced relationship from the lower main surface to the upper main surface of said substrate in a common direction substantially transverse to the lower and upper main surfaces and disposed within said configuration and area of said internal electrode and through which a corresponding array of portions of the lower surface of the internal electrode are exposed; and
    a back-side electrode formed as a layer on said lower main surface of said substrate and including an array of plural, integral portions thereof extending through the respective through holes of said array thereof and into contact with the lower surface of the internal electrode at said array of exposed portions thereof.

2. A semiconductor device as claimed in claim 1 in which said through holes are arranged in a row and column formation with a substantially uniform mutual separation between adjacent through holes of each row and of each column.

3. A semiconductor device as claimed in claim 2 wherein each of said through holes has a diameter of about 10 μm to about 20 μm and the shortest distance of said mutual separation, as measured between the respective circumferences of adjacent through holes at said lower main surface of said substrate, is about 20 μm or less.

4. A semiconductor device as claimed in claim 1 in which each of said through holes is defined by an inner wall forming an obtuse angle with the lower main surface of the substrate.

5. A semiconductor device as claimed in claim 1 in which each of said through holes is defined by an inner wall extending substantially perpendicularly to the lower main surface of the substrate.

6. A semiconductor device as claimed in claim 1 further comprising:
    a brazing filler formed as a layer on the back-side electrode and such that said through holes, with the respective back-side electrode portions extending therethrough, are further, substantially filled by said brazing filler; and
    a metal base affixed by the brazing filler to the lower main surface of the substrate.

7. A semiconductor device as claimed in claim 6, wherein:
    each of said through holes is defined by an inner wall of said substrate extending between said lower and upper main surfaces and forming an obtuse angle with the lower main surface of said substrate;
    said respective, integral back-side electrode portions which extend through said through holes are formed as corresponding, interior layers on said side walls of said through holes, each of said interior layers defining a recess extending into the corresponding through hole from the lower main surface of said substrate; and
    said brazing filler substantially fills said recesses and forms a substantially uniform and continuous layer on said back-side electrode.

* * * * *

UNITED STATES PATENT AND TRADEMARK OFFICE
CERTIFICATE OF CORRECTION

PATENT NO. : 5,210,599
DATED : May 11, 1993
INVENTOR(S) : KAWAI

It is certified that error appears in the above-indentified patent and that said Letters Patent is hereby corrected as shown below:

On the Title Page:

Item [56] References Cited, under FOREIGN PATENT DOCUMENTS, the last number listed, change "218371" to --2118371--.

Col. 1, line 56, after "bottom" insert --side of the--.

Col. 2, line 31, change "C-$C_3$" to --$C_1$-$C_3$--.

Col. 5, lines 50-51, delete the paragraph break.

Signed and Sealed this

Twenty-first Day of June, 1994

Attest:

BRUCE LEHMAN

*Attesting Officer*    *Commissioner of Patents and Trademarks*